United States Patent [19]

Nagumo

[11] 4,213,145
[45] Jul. 15, 1980

[54] SOLID STATE COLOR TELEVISION CAMERA

[75] Inventor: Fumio Nagumo, Yokohama, Japan

[73] Assignee: Sony Corporation, Tokyo, Japan

[21] Appl. No.: 3,727

[22] Filed: Jan. 15, 1979

[30] Foreign Application Priority Data

Jan. 30, 1978 [JP] Japan .................................. 53-9141

[51] Int. Cl.$^2$ .............................................. H04N 9/07
[52] U.S. Cl. ......................................... 358/43; 358/41
[58] Field of Search ............................. 358/43, 41, 44

[56] References Cited

U.S. PATENT DOCUMENTS

| | | | |
|---|---|---|---|
| 3,982,274 | 9/1976 | Chai | 358/41 |
| 4,054,906 | 10/1977 | Yamanaka | 358/43 |
| 4,149,182 | 4/1979 | Yamanaka et al. | 358/43 |

OTHER PUBLICATIONS

Hoagland, "TV Applications of Interline-Transfer CCD Arrays", Conference on CCD Technology and Applications, pp. 152-156, 12-2-76.

Primary Examiner—Richard Murray
Attorney, Agent, or Firm—Hill, Van Santen, Steadman, Chiara & Simpson

[57] ABSTRACT

A CCD (charge-coupled device) color camera is disclosed, wherein an installed CCD imager is capable of reading out signals of two adjacent rows of sensing elements simultaneously, besides employing an interlacing scanning technique. A color coding filter facing a sensing area of the CCD imager is arranged basically to have successive sets of color elements each set consisting of a blue color element and three red color elements in the vertical direction. In the signal processing system, two adjacent lines of video signals derived from the CCD imager are employed in order to separate red and blue color signals.

9 Claims, 25 Drawing Figures

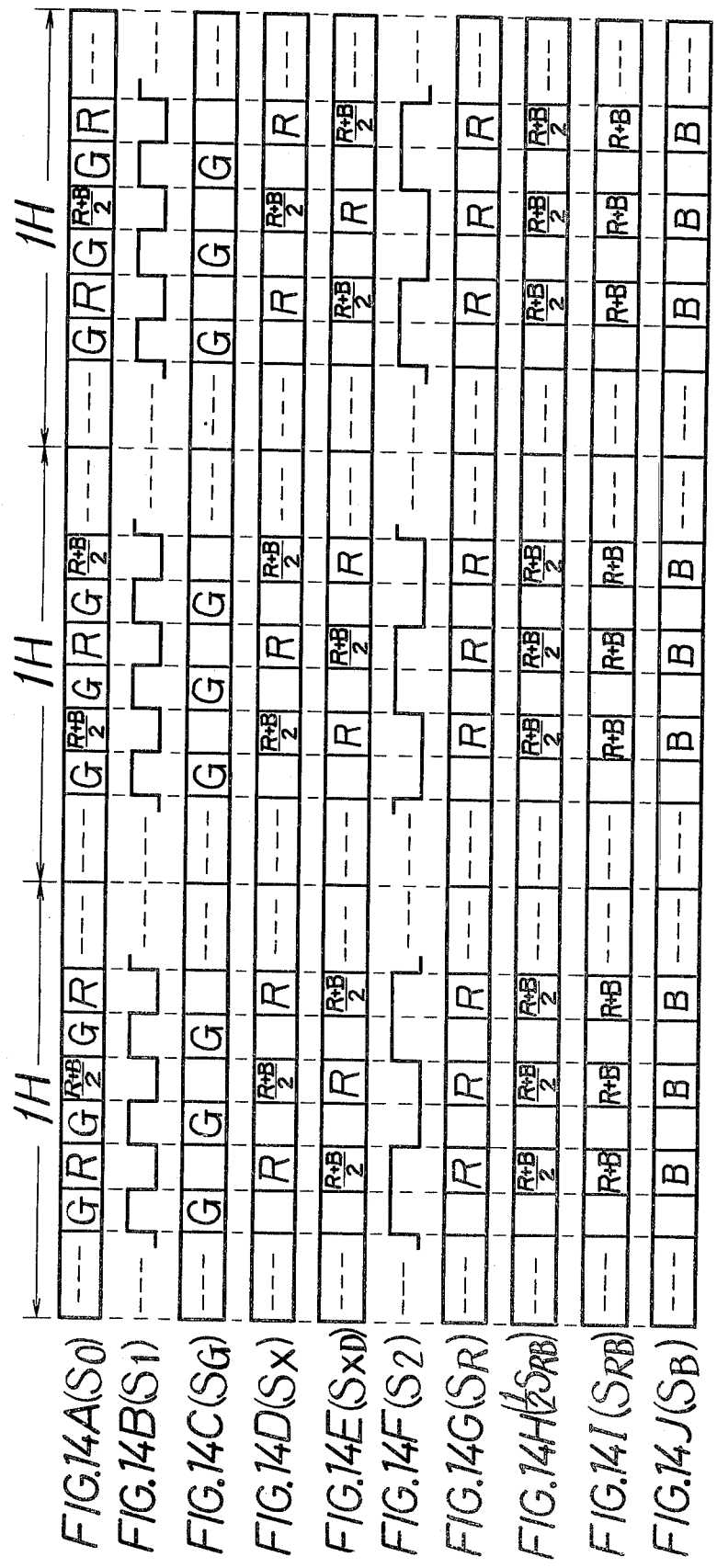

SOLID STATE COLOR TELEVISION CAMERA

BACKGROUND OF THE INVENTION

1. Field of the Invention

This invention relates to a solid state color television camera, and particularly to a color camera in which an interlacing pickup system is employed.

2. Description of the Prior Art

As one method for reading out signals from a solid state image sensor, there has been proposed a method such as that shown in FIG. 1, at respective horizontal intervals, or Nth, (N+1)th, (N+2)th, . . . horizontal intervals of a frame, signals of two adjacent rows of sensing elements are simultaneously read out in mixed condition, while at respective horizontal intervals of even-numbered fields, or (N+263)th, (N+264)th, (N+265)th, . . . horizontal intervals of a frame, signals of two adjacent rows, which are shifted by one row relative to the former, are simultaneously read out. In this case, an alignment of unit sensing elements in a direction corresponding to the horizontal direction of the picture screen is taken as a row.

Though having an advantage such as less visual persistence, this method has not been used in a color pickup system by reason of difficult color separation.

In this method, a pair of unit sensing elements read out simultaneously are alternated at every field. Now, let it be arranged to use such a color filter that, for example, as shown in FIG. 2, a color element of the filter corresponding to one unit sensing element for penetrating therethrough a red color light and a color element thereof corresponding to one unit sensing element for penetrating therethrough a blue color light are sequentially alternated in a direction corresponding to the vertical direction of the picture screen. In this case, at odd-numbered field and also at even-numbered field a red and blue mixed color, namely, a magenta color signal, will be picked up at respective horizontal intervals so that a red color signal and a blue color signal can not be separated from each other.

It is also arranged to use such a color filter that, as shown in FIG. 3, color elements of the filter corresponding to two unit sensing elements for penetrating therethrough a red color light and color elements thereof corresponding to two unit sensing elements for penetrating therethrough a blue color light are sequentially alternated in the vertical direction. In this case, at an odd-numbered field the red color signal and the blue color signal are picked up alternately at every horizontal interval, but at an even-numbered field the red and blue mixed color signal will be picked up at each horizontal interval. In this case, if signals at odd-numbered field are stored for one field and these signals are modified with signals read-out at even-numbered field, the red color signal and the blue color signal may be separated from each other even at the even-numbered field. However, it is complicated and not practical.

SUMMARY OF THE INVENTION

It is a primary object of this invention to provide a solid state color television camera free from the above drawback.

It is another object of this invention to provide a new and novel color coding filter to be employed in a solid state color television camera wherein an interlaced image pickup system is introduced.

It is further another object of this invention to provide a color coding filter to be used in either a single-chip type color camera or two-chip type color camera.

According to a color filter of this invention, color decoding is always done without failure even though an interlacing pick-up method is introduced.

In the solid state imaging device to be used in this invention, each of two rows of picture elements aligned in the horizontal direction generates a video signal corresponding to a single horizontal scan interval. In order to generate decodable color signals at any field, a ratio of length of color filter elements for first and second colors is preferably selected to 1:3 in the vertical direction. The decoding of color signals is carried out by using signals of two adjacent horizontal scan intervals.

The other objects, features and advantages of this invention will be apparent from the following description taken in conjunction with the accompanying drawings.

BRIEF DESCRIPTION OF THE DRAWINGS

FIG. 6 is a view showing one example of a color filter used in this invention;

FIGS. 7 and 8 are views used for explaining the color filter of FIG. 6;

FIG. 9 is a view showing another example of a color filter used in this invention;

FIGS. 10 and 11 are views used for explaining the color filter of FIG. 9;

FIG. 12 is a view showing a further example of a color filter used in this invention;

FIGS. 14A through 14J are views used for explaining the circuit of FIG. 13.

DESCRIPTION OF THE PREFERRED EMBODIMENTS

Prior to detailed description of this invention, the construction of a solid state imaging device and camera system usable in this invention will be briefly described with reference to FIGS. 4A, 4B and 4C.

Figure 1:
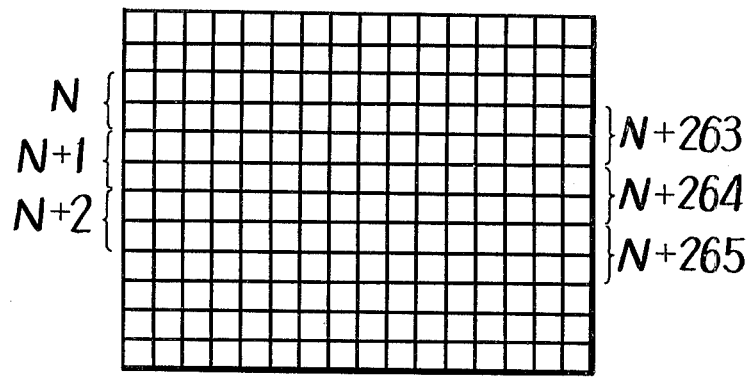
FIG. 1 is a view showing one example of a CCD image sensor used in this invention.
Figure 2:
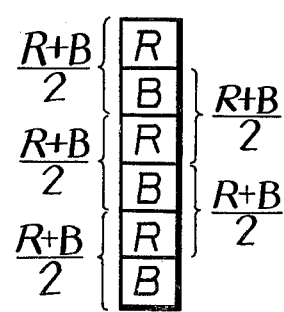
FIGS. 2 and 3 are views showing one part of color filters used for explaining prior art.
Figure 3:
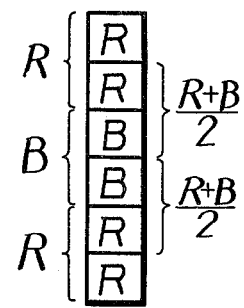
Figure 4A:
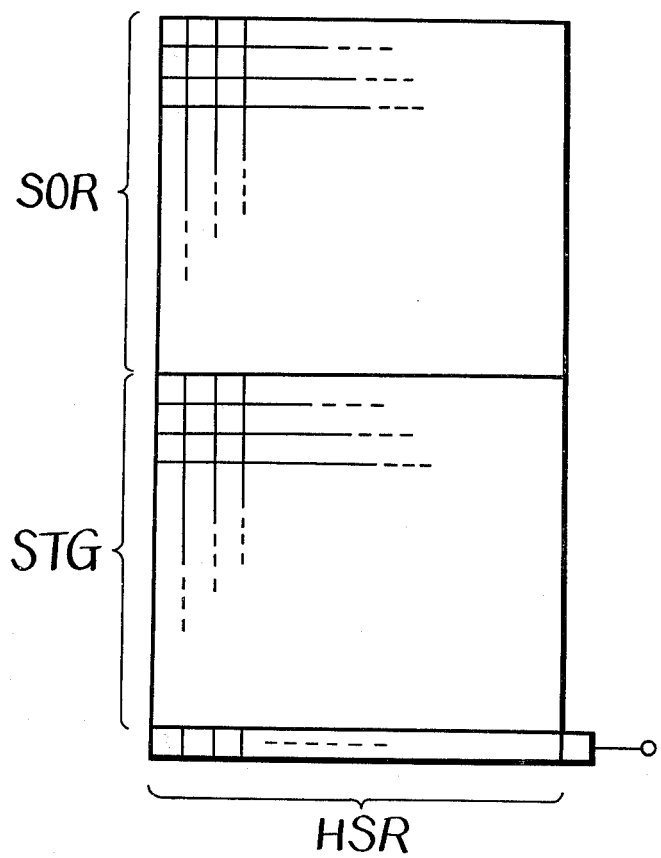
FIGS. 4A, 4B and 4C are views used for explaining a solid state color image sensing device and system of this invention.

FIG. 4A shows a frame transfer type CCD imager, which is composed of a sensor portion SOR, a storage portion STG and a horizontal shift register portion HSR, as has been well known. The sensor portion SOR corresponds to the portion shown in FIG. 1, and an object image is focused onto this sensor portion SOR. The storage portion STG is the same in construction as the sensor portion SOR except that the former is shielded optically. This type of CCD imager is well known so that a detailed description thereof will be omitted. However, when the above imager is used in this invention, signals of the storage portion STG corresponding to two rows must be transferred to the horizontal shift register portion HSR at each horizontal blanking interval. This shift can be performed by controlling shift clock signals to be applied to the storage portion STG. Due to the above manner of reading-out signals, the description with reference to FIG. 1 will be applicable to this case.

Figure 4B:
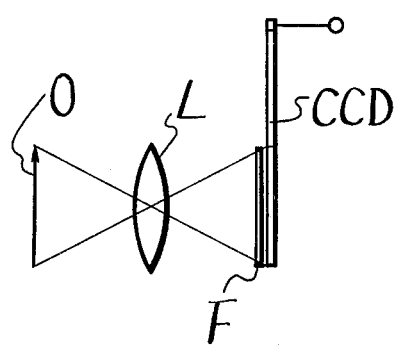
Figure 4C:
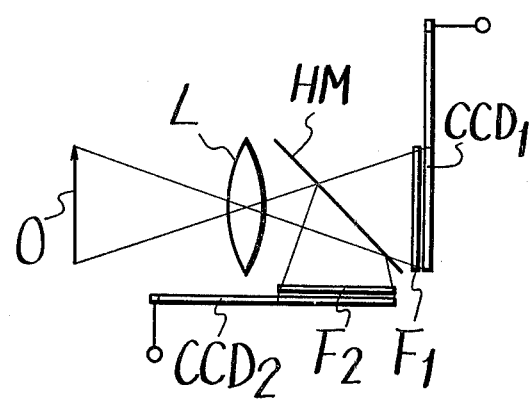

When being practically constructed as a television camera system, such arrangements will be made as shown in FIGS. 4B and 4C. In the case of a single-chip type color camera, as shown in FIG. 4B an image of an object O is focused through a lens L and a color filter F onto the CCD sensor portion. When using a two-chip type color camera, as shown in FIG. 4C, the image from the object O must be split by a half mirror HM before being focused through, for example, a green color filter $F_1$ onto the sensor portion $CCD_1$ and through a red-blue color filter $F_2$ onto the sensor portion $CCD_2$, respectively.

Figure 5:
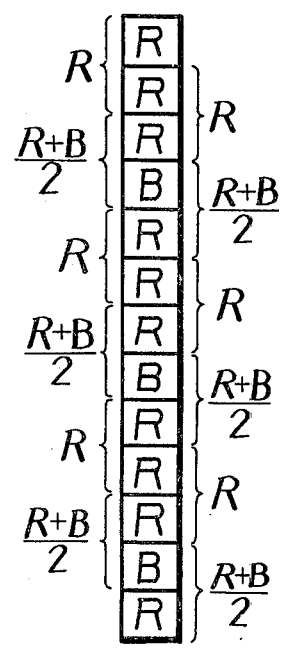
FIG. 5 is a view showing one example of a part of a color filter used for explaining the principle of this invention.

A description will next be given on a principle of this invention with reference to FIG. 5. In this invention, there is used a color filter in which color elements of the filter corresponding to successive three unit sensing elements of the solid state image sensor for penetrating therethrough, for example, red color light and a color element thereof corresponding to one unit sensing element for penetrating therethrough, for example, blue color light are alternated sequentially in the vertical direction as shown in FIG. 5. According to this example, at odd-numbered field as well as even-numbered field, a red color signal and a red and blue mixed color signal are taken out alternately at every horizontal interval. Accordingly, if a modification is performed between signals at adjacent horizontal intervals, the red and blue color signals can be separated.

Figures 6, 7, 8:
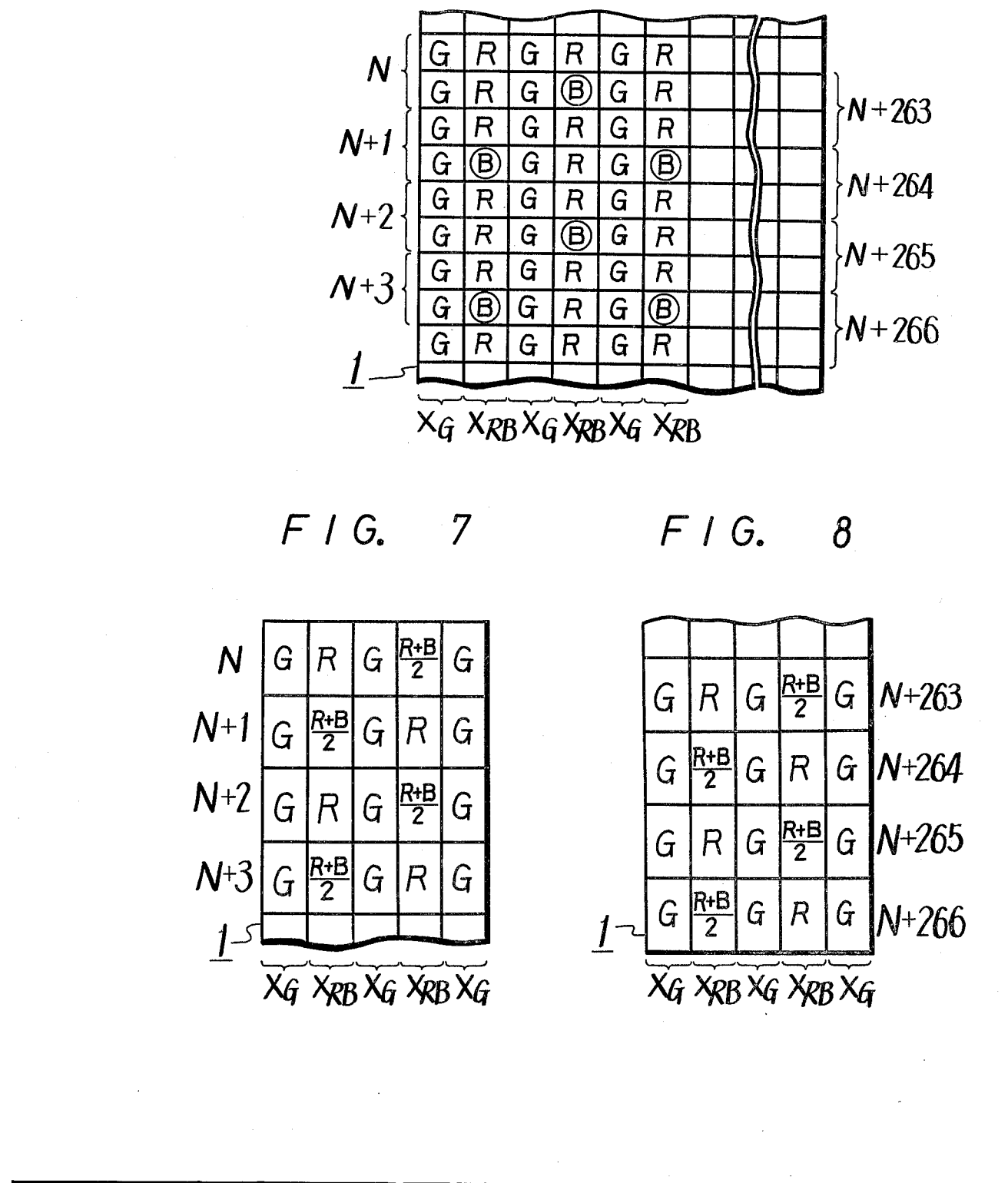

FIG. 6 shows one example of a color filter used in a single-chip type color camera according to this invention. In FIG. 6, provided that a column is defined by unit sensing elements of the solid state sensor device aligned in the vertical direction, a stripe $X_G$ of the color filter 1 corresponding to each of alternate columns of the solid state image sensor is adapted to be penetrated therethrough by a green color light only. A stripe $X_{RB}$ corresponding to each of the other alternate columns of the solid state image sensor is arranged in a manner that color elements of the filter 1 corresponding to successive three unit sensing elements for penetrating therethrough red color light and a color element thereof corresponding to one unit sensing element for penetrating therethrough blue color light are alternated sequentially as described with reference to FIG. 5. In this case, blue color light penetrating elements in one stripe $X_{RB}$ are preferably arranged in an interleaving relation with those in its alternate stripes $X_{RB}$. In other words, a blue color light penetrating element in one stripe $X_{RB}$ is arranged at a position which corresponds to an intermediate position between two blue color light penetrating elements in its alternate stripe $X_{RB}$ as shown in FIG. 6.

With the above arrangement, when using the read-out method as mentioned previously, the color filter 1 is equivalently shown as in FIG. 7 at odd-numbered field, and shown as in FIG. 8 at even-numbered field. Accordingly, a green color signal, a red color signal and a blue color signal can be separated from one another in a manner as will be described later.

Figures 9, 10, 11:
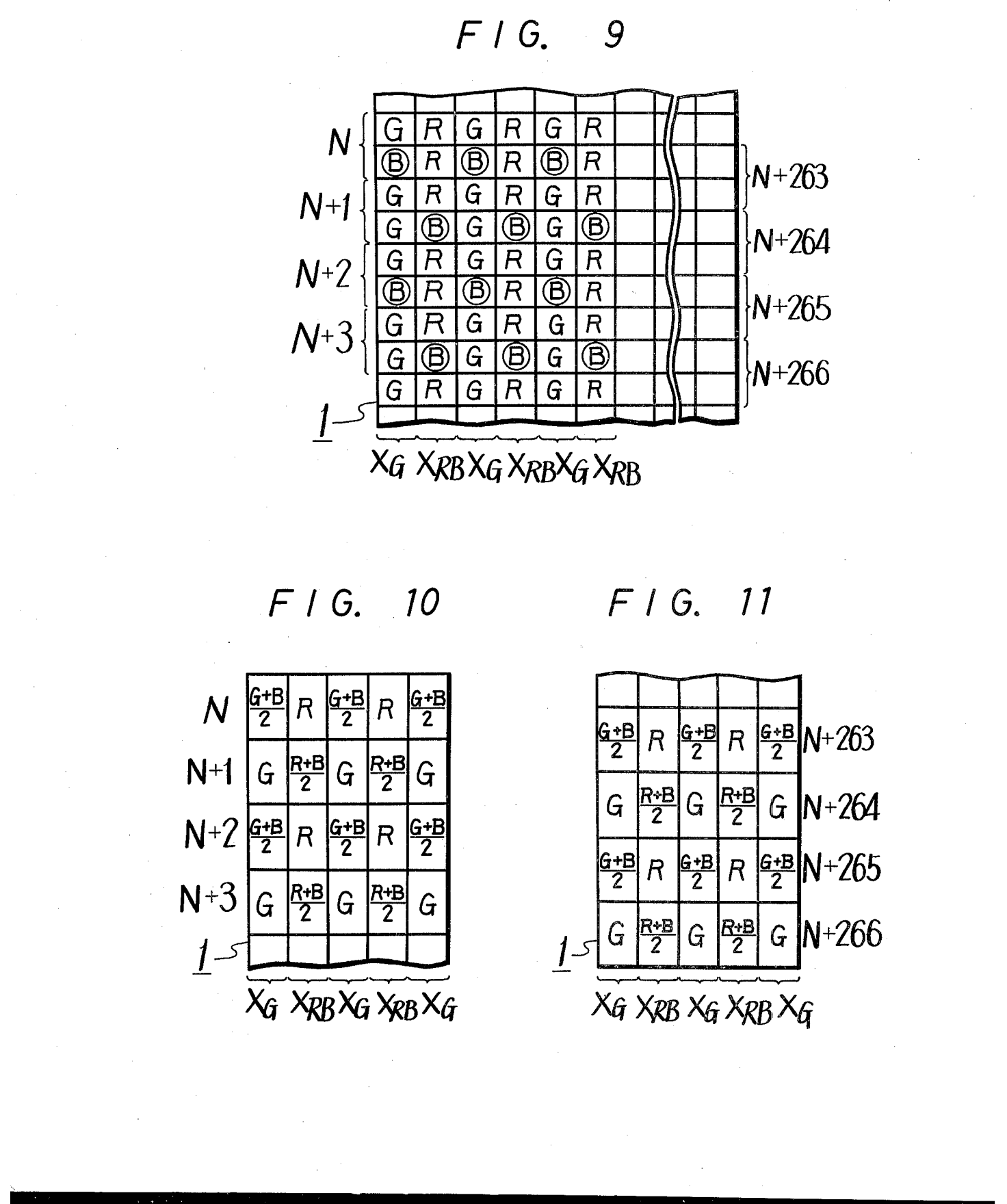

FIG. 9 shows another example of a color filter used in the single-chip type color camera, in which a stripe $X_G$ is arranged in such a manner that color elements of the filter 1 corresponding to three successive unit sensing elements of the solid state image sensor for penetrating therethrough green color light and a color element thereof corresponding to one unit sensing element for penetrating therethrough blue color light are alternated sequentially in the vertical direction. The arrangement of another stripe $X_{RB}$ is the same as that in FIG. 6. In this case, between adjacent stripes $X_G$ and $X_{RB}$, a blue color light penetrating element in one stripe is preferably arranged at a position corresponding to an intermediate position between two blue color light penetrating elements in the other stripe, that is, they are arranged in an interleaving relation with each other.

With the above arrangement, when using the read-out method as mentioned previously, the color filter 1 is equivalently shown as in FIG. 10 at odd-numbered field, and shown as in FIG. 11 at even-numbered field. Accordingly, a green color signal, a red color signal and a blue color signal can similarly be separated from one another in a manner as will be described later.

Figure 12:
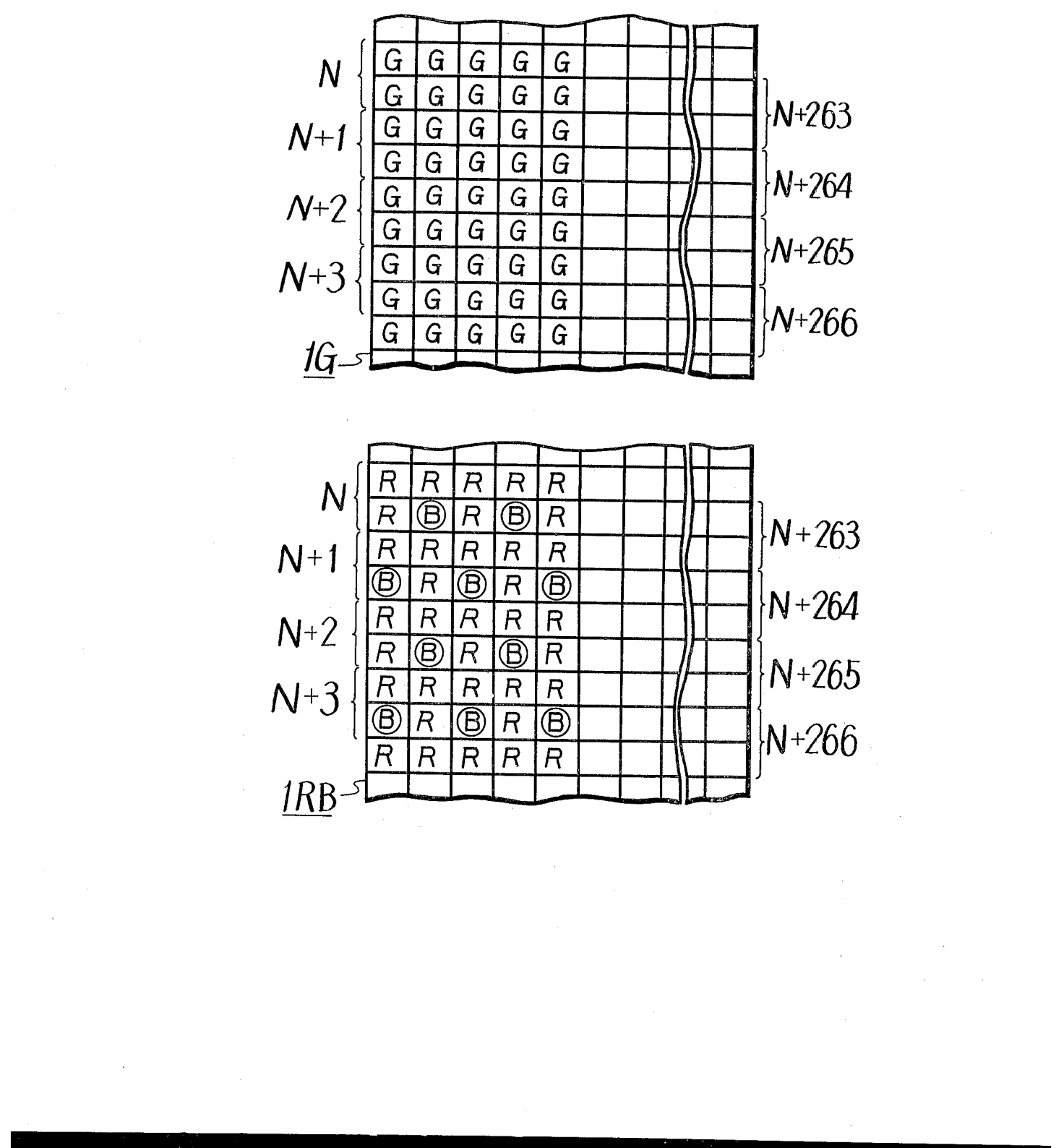

FIG. 12 shows an example of color filters used in a two-chip type color camera. These color filters consist of a color filter 1G disposed facing one solid state sensor and a color filter 1RB disposed facing the other solid state sensor. The color filter 1G is adapted to be penetrated therethrough with, for example, green color light only at its portion corresponding to all of unit sensing elements of the solid state sensor. Meanwhile, the color filter 1RB is formed in such a manner that at each of all stripes corresponding to the columns of the solid state sensor, color elements corresponding to successive three unit sensing elements for penetrating therethrough red color light and a color element corresponding to one unit sensing element for penetrating therethrough blue color light are alternated sequentially in the vertical direction. In this case, it is preferable in the color filter 1RB that a blue color light penetrating element in one stripe is located at a position corresponding to an intermediate position between two blue color light penetrating elements in the adjacent stripe in the same manner as in FIG. 9.

Figure 13:
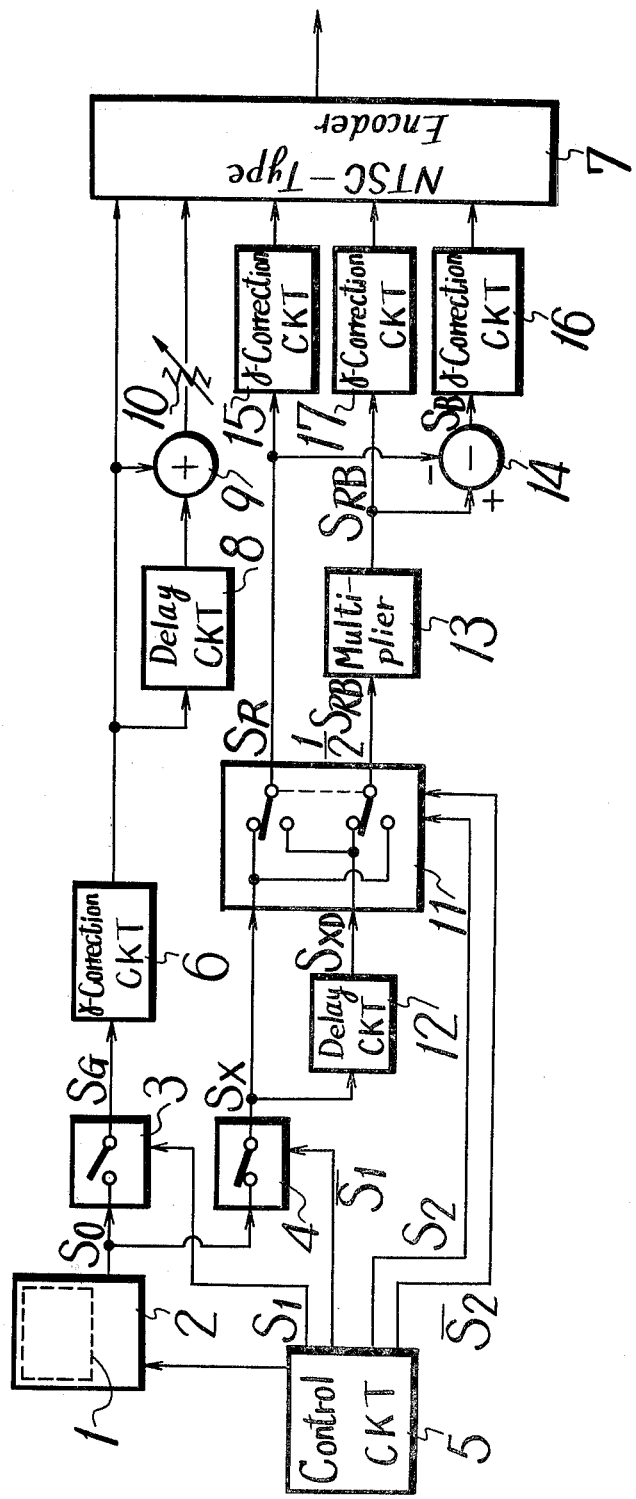
FIG. 13 is a block diagram showing one example of a signal processing circuit used in this invention.

FIG. 13 shows an example of a circuit for decoding or separating each color signal from signals which are read out from the solid state image sensor. This circuit is applicable for a single-chip type color camera so that, for example, the color filter 1 as shown in FIG. 6 is disposed in front of the solid state sensor 2.

As will be apparent from FIGS. 7 and 8, a signal $S_O$ (refer to FIG. 14A) read out from the solid state sensor 2 is arranged in such a manner that at an odd-numbered field and also at an even-numbered field, a green color signal, a red color signal, a green color signal, and a red and blue mixed color signal are alternately succeeded in this order and the phases of the red color signal and red-blue mixed color signal relative to the horizontal synchronizing signal are respectively reversed at every horizontal interval.

This signal $S_O$ is supplied to switch circuits 3 and 4. A control circuit 5 produces a switching signal $S_1$ (refer to FIG. 14B) and its inverted signal $\bar{S}_1$, which are respectively fed to the switch circuits 3 and 4 to change-over them so that a green primary color signal $S_G$ (refer to FIG. 14C) is obtained from the switch circuit 3 and a color signal $S_X$ (refer to FIG. 14D) including alternating red color signals and red-blue mixed color signals is obtained from the switch circuit 4, respectively. The green primary color signal $S_G$ is supplied through a gamma-correction circuit 6 (hereinafter referred to as a $\gamma$-correction circuit 6) to an NTSC-type encoder u. The signal from the $\gamma$-correction circuit 6 is also applied to a delay circuit 8 where it is delayed one line interval. The thus delayed signal and the signal from the $\gamma$-correction circuit 6 are added together at an adder 9, and thus added signal is fed through a level adjuster 10 to the encoder 7.

Meanwhile, the signal $S_X$ from the switch circuit 4 is supplied to a double switch circuit 11. This signal $S_X$ is also fed to a delay circuit 12 where it is delayed one line interval and thus delayed signal $S_{XD}$ (refer to FIG. 14E) is supplied to the circuit 11. A switching signal $S_2$ (FIG. 14F) and its inverted signal $\overline{S}_2$ from the control circuit 5 are applied to the circuit 11 to change-over it so that a red primary color signal $S_R$ (FIG. 14G) is obtained from one output end of the circuit 11 and a red-blue mixed color signal $\frac{1}{2}S_{RB}$ (FIG. 14H) is obtained from the other output end thereof, respectively.

The red and blue mixed color signal $\frac{1}{2}S_{RB}$ is then fed to a multiplier 13 where it is doubled in level to obtain a mixed color signal $S_{RB}$ (refer to FIG. 14I). This mixed color signal $S_{RB}$ and the red primary color signal $S_R$ from the circuit 11 are fed together to a subtractor 14 where the latter is subtracted from the former to obtain a blue primary color signal $S_B$ (refer to FIG. 14J).

Thus, the red primary color signal $S_R$ from the circuit 11, the blue primary color signal $S_B$ from the subtractor 14 and the red and blue mixed color signal, namely a magenta color signal, $S_{RB}$ from the multiplier 13 are supplied respectively through $\gamma$-correction circuits 15, 16 and 17 to the NTSC-type encoder 7.

According to this invention, even when a specific readout method with less visual persistence is used, this method can be used in the color pickup system. Besides a color element of the color filter corresponding to one picture element of the solid state image sensor can be made sufficient to permit the penetration of each primary color signal therethrough so that the manufacturing of the color filter is simplified.

Even in the case of using another type of color filters, a circuit for separating color signals can be constructed by a similar consideration. Further, the solid state imaging device used in this invention is not limited to the frame transfer type CCD imager, provided that it can simultaneously read out signals of adjacent two rows of sensing elements.

It will be apparent that many modifications and variations may be effected without departing from the scope of the novel concepts of this invention.

I claim as my invention:

1. A solid state color camera employing at least one solid state image sensing device which simultaneously reads out signals of adjacent two rows of sensing elements as a video signal of a single horizontal scan line in sequence with an interlacing technique, comprising:
   (A) color coding filter means having a plurality of color elements corresponding to respective sensing elements of said solid state image sensing device, said filter means being arranged to have successive sets of color elements each consisting of a first color element and three second color elements in the vertical direction, and
   (B) color signal processing means for separating first and second color signals corresponding to said first and second color elements by arranging two adjacent lines of video signals derived from said solid state imaging device.

2. A solid state color camera as set forth in claim 1, wherein said first color elements of one column of said color coding filter means are positioned in an interleaving relation with the first color elements of the alternate columns.

3. A solid state color camera as set forth in claim 2, wherein columns of third color elements only are arranged in an alternate relation with columns of said first and second color elements.

4. A solid state color camera as set forth in claim 3, wherein said third color is green.

5. A solid state color camera as set forth in claim 1, wherein a second solid state imaging device is employed, and second color coding filter means for third color elements only is disposed in front of said second solid state imaging device.

6. A solid state color camera as set forth in claim 5, wherein said third color is green.

7. A solid state color camera as set forth in claim 1, wherein columns having successive sets of color elements each consisting of a first color element and three third color elements in the vertical direction are arranged in an alternate relation with the columns having said successive sets of a first and three second color elements.

8. A solid state color camera as set forth in claim 7, wherein said third color is green.

9. A solid state color camera as set forth in claim 1, wherein said first color is blue and said second color is red.

* * * * *